United States Patent
Yang et al.

(10) Patent No.: US 10,319,830 B2
(45) Date of Patent: Jun. 11, 2019

(54) HETEROJUNCTION BIPOLAR TRANSISTOR POWER AMPLIFIER WITH BACKSIDE THERMAL HEATSINK

(71) Applicant: QUALCOMM Incorporated, San Diego, CA (US)

(72) Inventors: Bin Yang, San Diego, CA (US); Gengming Tao, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 15/597,386

(22) Filed: May 17, 2017

(65) Prior Publication Data
US 2018/0211897 A1  Jul. 26, 2018

Related U.S. Application Data

(60) Provisional application No. 62/450,034, filed on Jan. 24, 2017.

(51) Int. Cl.
| | |
|---|---|
| *H01L 23/34* | (2006.01) |
| *H01L 21/00* | (2006.01) |
| *H01L 29/66* | (2006.01) |
| *H01L 23/367* | (2006.01) |
| *H01L 23/495* | (2006.01) |
| *H01L 29/737* | (2006.01) |

(Continued)

(52) U.S. Cl.
CPC .... *H01L 29/66318* (2013.01); *H01L 23/3672* (2013.01); *H01L 23/3677* (2013.01); *H01L 23/49568* (2013.01); *H01L 29/7371* (2013.01); *H01L 29/0821* (2013.01); *H01L 29/205* (2013.01); *H01L 29/41708* (2013.01)

(58) Field of Classification Search
CPC ......... H01L 29/66242; H01L 29/66318; H01L 29/7371; H01L 23/3672; H01L 23/49568; H01L 29/41708
USPC ......... 438/122; 257/625, 675, 706, 717–720, 257/795
See application file for complete search history.

(56) References Cited

U.S. PATENT DOCUMENTS

5,084,750 A * 1/1992 Adlerstein ............ H01L 23/481
257/197
5,185,274 A * 2/1993 Chang .................... H01L 21/28
257/198

(Continued)

FOREIGN PATENT DOCUMENTS

| EP | 1077494 A2 | 2/2001 |
| JP | 2013191655 A | 9/2013 |

OTHER PUBLICATIONS

Yim, "Direct and Indirect Optical Energy Gaps of AlAs", Journal of Applied Physics 42 (1971) pp. 2854-2856.*

(Continued)

*Primary Examiner* — Calvin Lee
(74) *Attorney, Agent, or Firm* — Seyfarth Shaw LLP

(57) ABSTRACT

A heterojunction bipolar transistor may include an emitter, a base contacting the emitter, a collector contacting the base, a sub-collector contacting the collector, and an electrical isolation layer contacting the sub-collector. The heterojunction bipolar transistor may also include a backside heatsink thermally coupled to the sub-collector and the collector. The backside heatsink may be aligned with a central axis of the emitter and the base.

10 Claims, 8 Drawing Sheets

(51) Int. Cl.
*H01L 29/205* (2006.01)
*H01L 29/417* (2006.01)
*H01L 29/08* (2006.01)

(56) References Cited

U.S. PATENT DOCUMENTS

| | | | | |
|---|---|---|---|---|
| 5,312,765 A * | 5/1994 | Kanber | ............... | H01L 21/8252 148/DIG. 164 |
| 5,449,930 A | 9/1995 | Zhou | | |
| 5,485,025 A * | 1/1996 | Chau | ................ | H01L 29/7371 257/197 |
| 5,719,433 A * | 2/1998 | Delage | ................ | H01L 23/367 257/522 |
| 5,734,193 A * | 3/1998 | Bayraktaroglu | .... | H01L 21/8252 257/197 |
| 5,739,578 A * | 4/1998 | Goto | ................ | H01L 29/73 257/578 |
| 5,864,169 A * | 1/1999 | Shimura | ........... | H01L 21/76898 257/197 |
| 5,986,324 A | 11/1999 | Adlerstein et al. | | |
| 6,031,255 A * | 2/2000 | Delage | ................ | H01L 23/367 257/197 |
| 6,049,099 A * | 4/2000 | Vaccaro | ............... | H01L 29/267 257/200 |
| 6,051,871 A * | 4/2000 | DeLaCruz | ........... | H01L 23/367 257/571 |
| 6,084,284 A * | 7/2000 | Adamic, Jr. | ........ | H01L 21/2007 257/347 |
| 6,121,842 A * | 9/2000 | Adlerstein | ................ | H03F 1/22 257/565 |
| 6,130,471 A * | 10/2000 | Boles | ................. | H01L 29/7304 257/577 |
| 6,376,867 B1 * | 4/2002 | Gutierrez-Aitken | ........................ H01L 29/0821 | 257/197 |
| 6,410,396 B1 * | 6/2002 | Casady | ............... | H01L 29/7378 257/197 |
| 6,414,371 B1 | 7/2002 | Freeman et al. | | |
| 6,492,195 B2 * | 12/2002 | Nakanishi | ........... | H01L 21/6835 257/E21.569 |
| 6,559,534 B1 * | 5/2003 | Floriot | .................... | H01L 23/36 257/706 |
| 6,600,179 B2 * | 7/2003 | Quaglietta | .......... | H01L 23/4821 257/197 |
| 6,696,711 B2 * | 2/2004 | Mochizuki | .......... | H01L 21/8252 257/197 |
| 6,844,575 B2 | 1/2005 | Shirakawa | | |
| 6,870,204 B2 * | 3/2005 | Torvik | ................ | H01L 29/1608 257/197 |
| 6,882,026 B2 * | 4/2005 | Shirakawa | .......... | H01L 21/8252 257/521 |
| 6,917,061 B2 * | 7/2005 | Pan | ..................... | H01L 29/0817 257/12 |
| 6,940,144 B2 * | 9/2005 | Nakayama | .......... | H01L 23/3677 257/135 |
| 7,064,432 B2 * | 6/2006 | Lee | ........................ | H01L 21/486 257/737 |
| 7,067,857 B2 * | 6/2006 | Mochizuki | .......... | H01L 27/0823 257/187 |
| 7,413,932 B2 | 8/2008 | Cho et al. | | |
| 7,564,074 B2 * | 7/2009 | Sadaka | ............... | H01L 27/0605 257/192 |
| 7,622,357 B2 | 11/2009 | Vaed et al. | | |
| 7,622,756 B2 * | 11/2009 | Sasaki | ..................... | H01L 23/66 257/205 |
| 7,795,707 B2 * | 9/2010 | Flynn | ..................... | C30B 25/02 257/194 |
| 8,633,496 B2 * | 1/2014 | Hata | ................... | H01L 27/1446 257/80 |
| 8,710,568 B2 * | 4/2014 | Ozeki | ..................... | H01L 25/16 257/302 |
| 8,772,830 B2 * | 7/2014 | Takada | .............. | H01L 21/02381 257/190 |
| 8,809,908 B2 * | 8/2014 | Takada | .............. | H01L 21/02381 257/190 |
| 8,860,092 B1 * | 10/2014 | Li | ..................... | H01L 29/66242 257/197 |
| 8,916,966 B2 * | 12/2014 | Mays | .................... | H01L 23/367 257/706 |
| 9,461,153 B2 * | 10/2016 | Cismaru | ........... | H01L 29/41708 |
| 9,472,484 B2 * | 10/2016 | Perkins | ................. | H01L 23/367 |
| 2002/0130409 A1 | 9/2002 | Oue et al. | | |
| 2003/0011045 A1 * | 1/2003 | Kleel | .................. | H01L 23/4824 257/587 |
| 2004/0061163 A1 | 4/2004 | Nakayama | | |
| 2007/0073448 A1 * | 3/2007 | Takubo | ............. | H01L 21/30617 700/302 |
| 2008/0088020 A1 * | 4/2008 | Miyajima | ........... | H01L 29/0603 257/750 |
| 2012/0126288 A1 * | 5/2012 | Bito | .................... | H01L 21/8252 257/192 |
| 2015/0380531 A1 * | 12/2015 | Xiao | ................... | H01L 29/0817 257/197 |
| 2016/0225689 A1 * | 8/2016 | Perkins | ............. | H01L 23/49811 |

OTHER PUBLICATIONS

Choi et al., "Effectiveness of non-linear graded buffers for In(Ga,Al)As metamorphic layers grown on GaAs(001)", Journal of Crystal Growth 311 (2009) pp. 1091-1095.*
International Search Report and Written Opinion—PCT/US2017/062637—ISA/EPO—dated Feb. 23, 2018.

* cited by examiner

HETEROJUNCTION BIPOLAR TRANSISTOR POWER AMPLIFIER WITH BACKSIDE THERMAL HEATSINK

CROSS-REFERENCE TO RELATED APPLICATION

The present application claims the benefit of U.S. Provisional Patent Application No. 62/450,034, filed on Jan. 24, 2017, and titled "HBT POWER AMPLIFIERS WITH NOVEL THERMAL HEAT SINK FROM BACKSIDE," the disclosure of which is expressly incorporated by reference herein in its entirety.

BACKGROUND

Field

The present disclosure relates generally to wireless communication systems, and more specifically, to a heterojunction bipolar transistor-based radio frequency (RF) device with a backside thermal heatsink.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation.

The implementation of carrier aggregation in mobile RF transceivers enables a wireless carrier to increase available bandwidth by simultaneously using multiple frequencies for a single communication stream. While an increased amount of data is provided to the end user, successful implementation of carrier aggregation complicates thermal power specifications of power amplifiers in the mobile RF transceiver. These thermal power specifications are further complicated because RF power amplifiers are generally not fabricated using a CMOS (complementary metal-oxide-semiconductor) process. Because compound semiconductor materials (e.g., column III and column V (III-V) or column II and column IV (II-VI)) generally exhibit poor thermal conduction capabilities, it is difficult to meet thermal power specifications in compound semiconductor devices (e.g., III-V or II-VI), such as heterojunction bipolar transistor (HBT)-based power amplifiers.

SUMMARY

A heterojunction bipolar transistor may include an emitter, a base contacting the emitter, a collector contacting the base, a sub-collector contacting the collector, and an electrical isolation layer contacting the sub-collector. The heterojunction bipolar transistor may further include a backside heatsink thermally coupled to the sub-collector and the collector. The backside heatsink may be aligned with a central axis of the emitter and the base.

A method of making a backside thermal heatsink of a power amplifier may include forming a heterojunction bipolar transistor device. The method may also include forming an electrical isolation layer on a sub-collector of the heterojunction bipolar transistor device. The method may further include fabricating the backside thermal heatsink through a substrate of the heterojunction bipolar transistor device. The backside thermal heatsink may be aligned with a central axis of an emitter and a base of the heterojunction bipolar transistor device.

A heterojunction bipolar transistor-based power amplifier may include an emitter, a base contacting the emitter, a collector contacting the base, a sub-collector contacting the collector, and an electrical isolation layer contacting the sub-collector. The heterojunction bipolar transistor-based power amplifier may also include means for thermally dissipating heat from the collector through the sub-collector and the electrical isolation layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
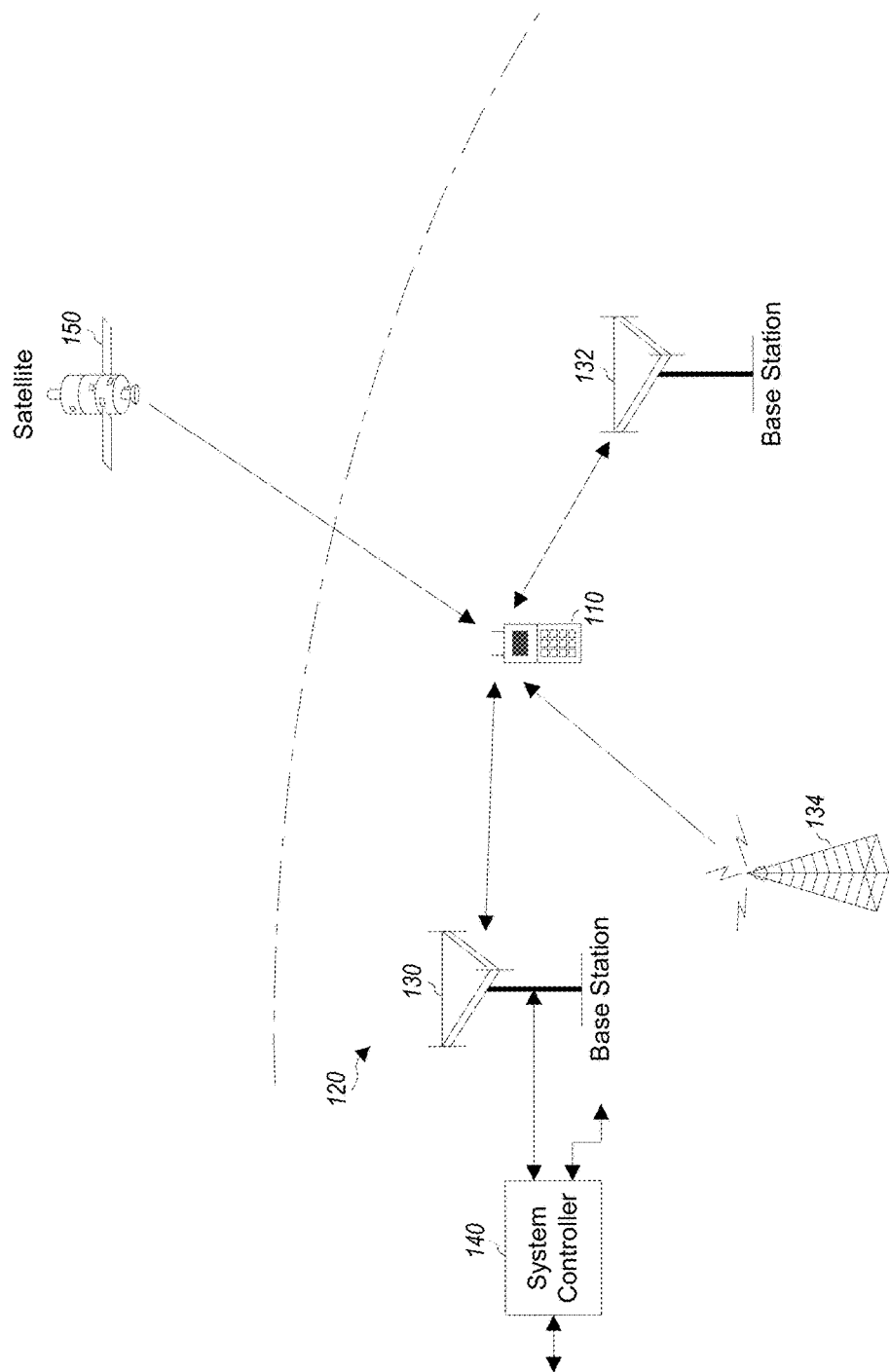
FIG. 1 shows a wireless device communicating with a wireless system, according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise, and other performance considerations. The design complexity of these mobile RF transceivers is further complicated by added circuit functions to support communication enhancements, such as carrier aggregation. The implementation of carrier aggregation in mobile RF transceivers enables a wireless carrier to increase available bandwidth by simultaneously using multiple frequencies for a single communication stream.

While an increased amount of data is provided to the end user, successful implementation of carrier aggregation complicates thermal specifications of power amplifiers in a mobile RF transceiver. For example, in a mobile RF transceiver, a communication signal is amplified and transmitted by a transmit section. The transmit section may include one or more circuits that amplify and transmit the communication signal. The amplifier circuits may include one or more amplifier stages that may have one or more driver stages and one or more power amplifier stages. Each of the amplifier stages may include one or more transistors configured in various ways to amplify the communication signal. The transistors configured to amplify the communication signal, however, are generally selected to operate at substantially higher frequencies, further complicating thermal power specifications.

These thermal power specifications are further complicated because RF power amplifiers are generally not fabricated using a CMOS (complementary metal-oxide-semiconductor) process. Because column III and column V (III-V) or column II and column IV (II-VI) compound semiconductor materials generally exhibit poor thermal conduction capabilities, it is difficult to meet thermal power specifications in III-V or II-VI compound semiconductor devices, such as heterojunction bipolar transistor (HBT)-based power amplifiers.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

A heterojunction bipolar transistor (HBT) integrated circuit (HBT chip) may include an HBT to provide a power amplifier. Unfortunately, 3G/4G HBT power amplifiers in mobile phones may suffer from thermal issues. In particular, a significant challenge in designing HBT-based power amplifiers is thermal stability, which may reduce a safe operating area size. As a result, heat dissipation is increasingly problematic for HBT-based power amplifiers. In fact, the compound semiconductor materials used by HBT-based power amplifiers may lead to localized thermal hot spots. As the localized thermal hot spots are embedded in the device, this may reduce the ability to cool the hot spots and achieve low junction temperatures. Conventional cooling solutions for achieving low junction temperatures include heatsinks, heat spreaders, and/or improved printed circuit boards. Conventional techniques of simply increasing the size of the heat spreader and/or the heatsink are impractical in small form factor devices (e.g., smartphones).

This thermal instability may be due to severe heat generated inside an HBT collector, for example, under an emitter/base region of an HBT-based power amplifier. Furthermore, compound semiconductor materials (e.g., gallium arsenide (GaAs)) used to fabricate HBT-based power amplifiers are poor thermal conductors relative to non-compound semiconductor materials (e.g., four times worse than silicon (Si))—because heat cannot easily spread from the substrate. Moreover, HBT emitter/base materials (e.g., indium GaAs (InGaAs)/indium gallium phosphide (InGaP)) exhibit poor thermal conductivity relative to GaAs (e.g., eight times worse).

An HBT-based power amplifier that combines compound semiconductor materials (e.g., a GaAs substrate supporting InGaAs/InGaP emitter/base materials) incurs a further reduction in thermal conductivity (e.g., thirty times worse). Together, these compound semiconductor materials lead to increased heat that cannot easily spread through a top portion of the HBT emitter. These thermal issues are further exacerbated by future 5G and 5G+ power amplifiers due to higher operating frequencies, which translates into higher dynamic power that generates heat. There is no effective heatsink in current HBT structures to handle thermal issues for 5G HBTs.

Aspects of the present disclosure may solve this problem by fabricating a heatsink for an HBT-based power amplifier directly under the heat source. In aspects of the present disclosure, the heatsink may be fabricated using a modified backside via process. Thermal heat dissipation may be improved by reducing a distance between the heatsink and the HBT-based power amplifier heat source (e.g., ~1 um), which significantly improves HBT thermal conductivity (e.g., by ~50%). A backside ground via may also be fabricated in electrical contact with an emitter of an HBT active device.

FIG. 1 shows a wireless device 110 communicating with a wireless communication system 120. The wireless communication system 120 may be a 5G system, long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
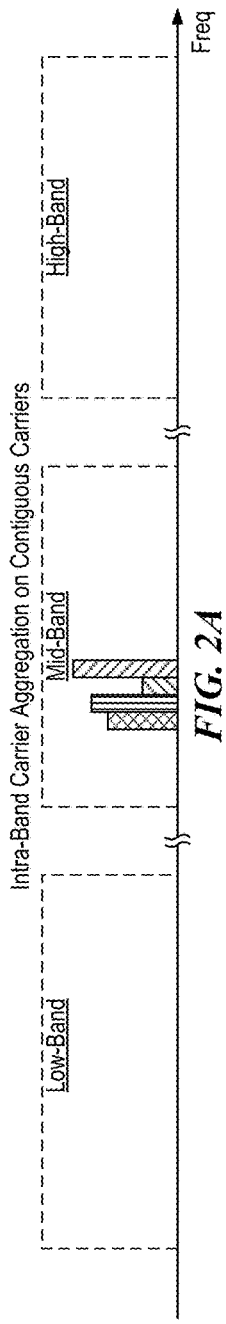
FIGS. 2A-2D show four examples of carrier aggregation (CA), according to aspects of the present disclosure.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
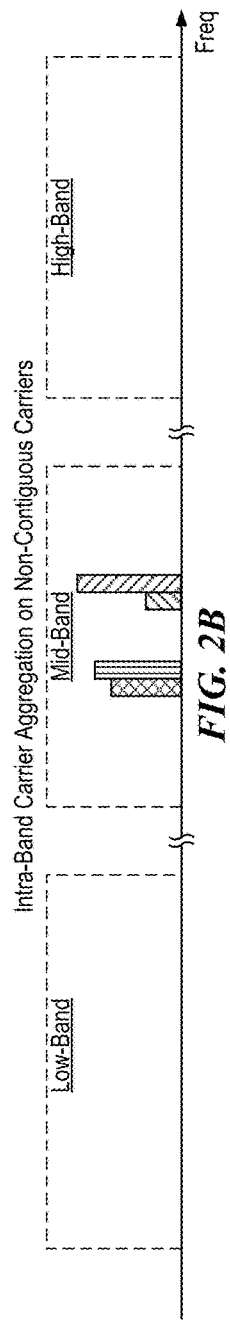

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:
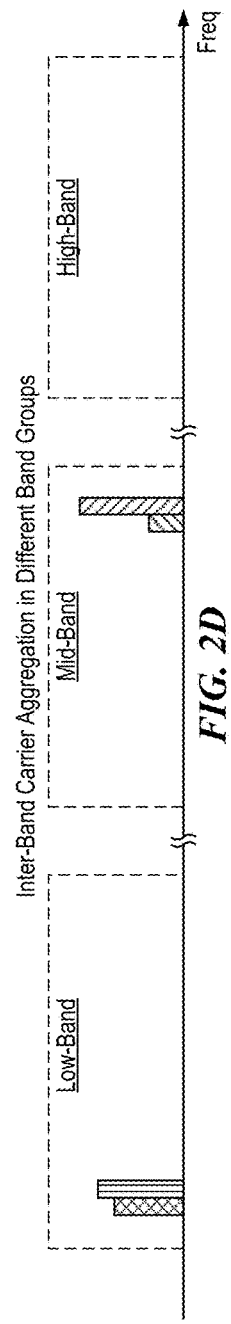

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
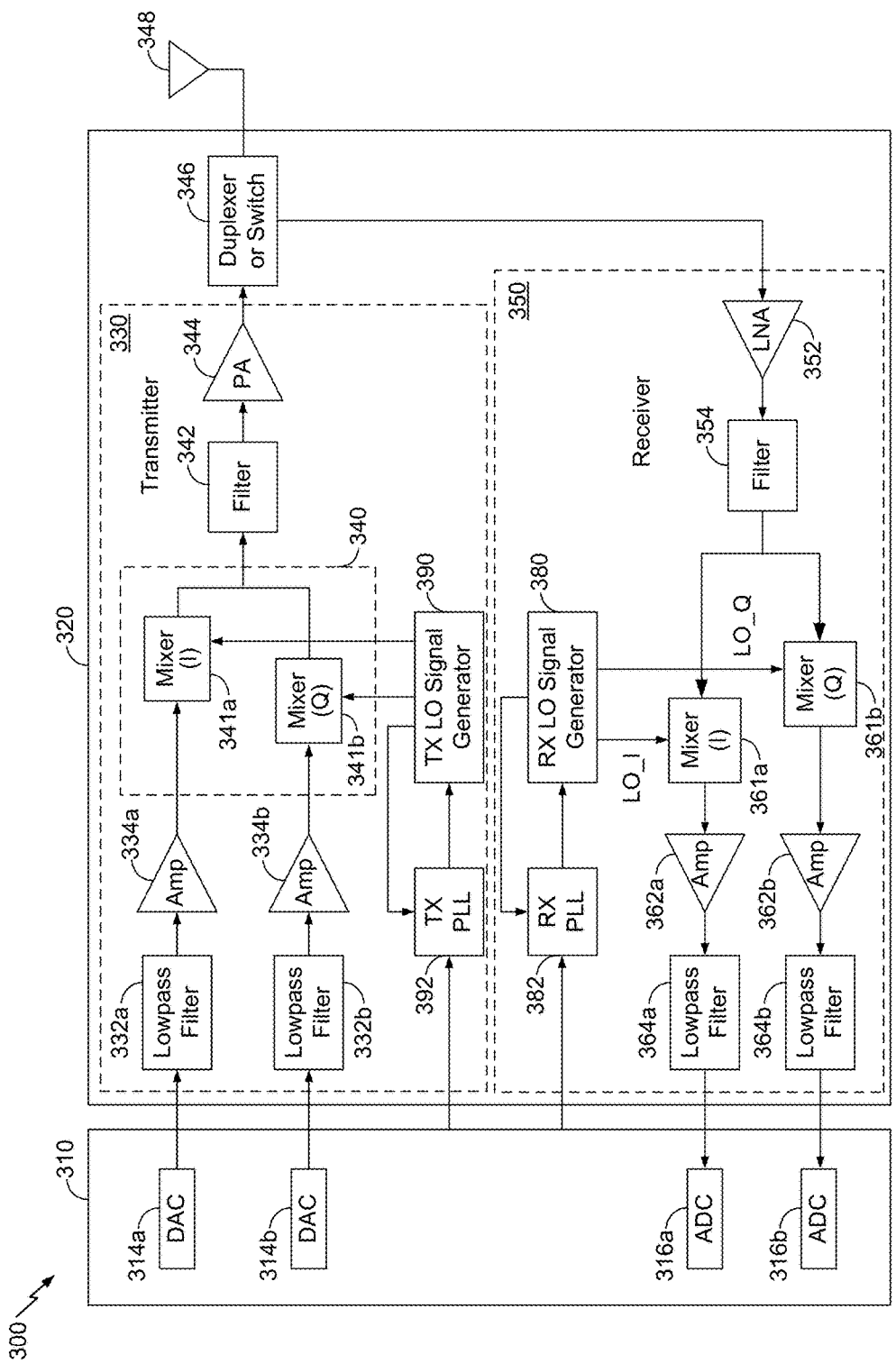
FIG. 3 shows a block diagram of the wireless device in FIG. 1, according to an aspect of the present disclosure.

FIG. 3 shows a block diagram of an exemplary design of a wireless device 300, such as the wireless device 110 shown in FIG. 1. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314*a* and 314*b* for converting digital signals generated by the data processor 310 into the in-phase (I) and quadrature (Q) analog output signals (e.g., I and Q output currents) for further processing.

Within the transmitter 330, lowpass filters 332*a* and 332*b* filter the in-phase (I) and quadrature (Q) analog transmit signals, respectively, to remove undesired images caused by the prior digital-to-analog conversion. Amplifiers (Amp) 334*a* and 334*b* amplify the signals from lowpass filters 332*a* and 332*b*, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361*a* and 361*b* mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362*a* and 362*b* and further filtered by lowpass filters 364*a* and 364*b* to obtain in-phase (I) and quadrature (Q) analog input signals, which are provided to the data processor 310. In the exemplary configuration shown, the data processor 310 includes analog-to-digital-converters (ADCs) 316*a* and 316*b* for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies, further complicating thermal power specifications. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Unfortunately, a significant challenge in designing HBT-based power amplifiers is thermal stability, which may reduce a safe operating area size. That is, heat dissipation is increasingly problematic in HBT-based power amplifiers. In particular, the compound semiconductor materials used by HBT-based power amplifiers may lead to localized thermal hot spots. As the localized thermal hot spots are embedded in the device, this may reduce the ability to cool the hot spots and achieve low junction temperatures. Conventional cooling solutions for achieving low junction temperatures include heatsinks, heat spreaders, and/or improved printed circuit boards. Unfortunately, conventional techniques of simply increasing the size of the heat spreader and/or the heatsink are impractical in small form factor devices (e.g., smartphones).

Aspects of the present disclosure may solve this problem by fabricating a heatsink for an HBT-based power amplifier directly under the heat source. In aspects of the present disclosure, the heatsink may be fabricated using a modified backside via process. This arrangement may improve thermal heat dissipation by reducing a distance between the heatsink and a heat source of an HBT-based power amplifier.

Figure 4:
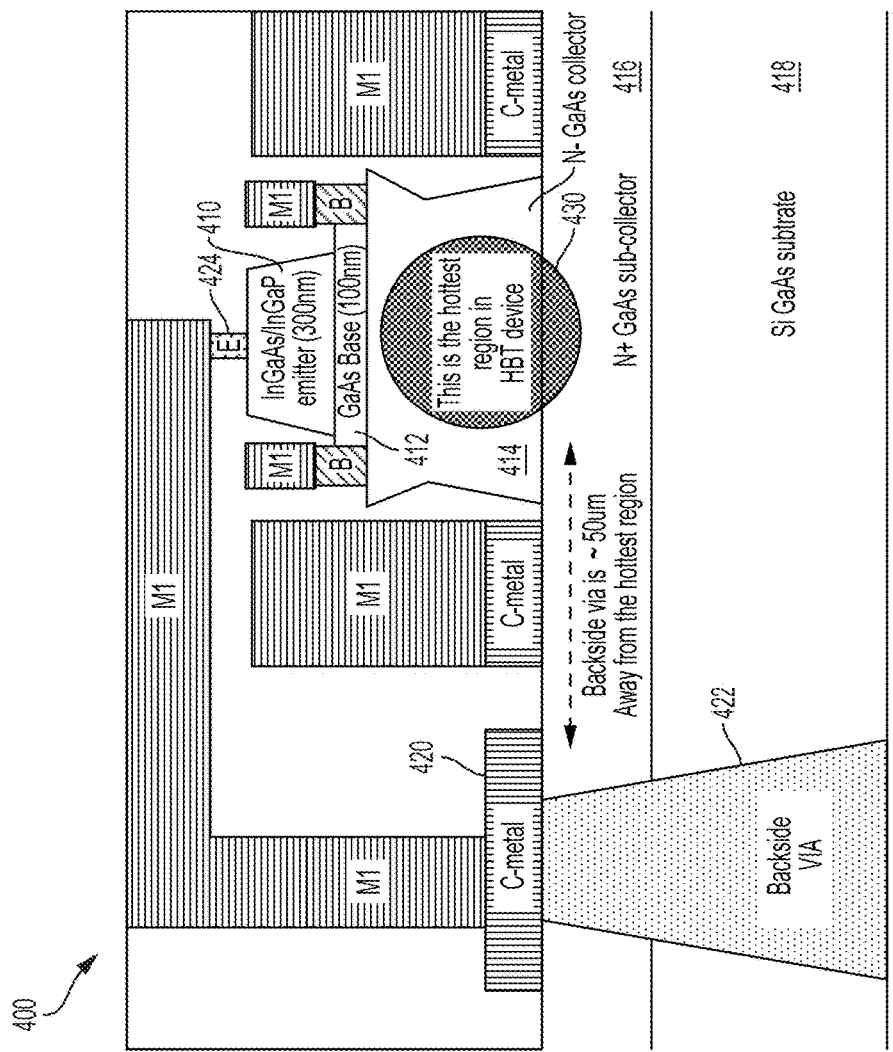
FIG. 4 shows a heterojunction bipolar transistor (HBT) device that suffers from poor heat dissipation.

FIG. 4 shows a heterojunction bipolar transistor (HBT) device 400 that suffers from poor heat dissipation. The device 400 includes an emitter 410, a base 412 contacting the emitter 410, a collector 414 contacting the base 412, and a sub-collector 416 contacting the collector 414. The sub-collector 416 is supported by a compound semiconductor substrate 418. A ground via 422 is electrically coupled to a collector contact 420 of the collector 414. A first metallization layer (M1) couples the collector contact 420 to the emitter contact 424.

In operation, heat 430 generated by the HBT device 400 accumulates below the emitter 410 of the HBT device 400. In particular, the heat 430 accumulates in the collector 414 and the sub-collector 416 of the HBT device 400. Unfortunately, the compound semiconductor materials of the collector 414 and the sub-collector 416 may trap the heat 430. That is, the poor thermal conductivity of the compound semiconductor materials of the collector 414 and the sub-collector 416 inhibit the heat from dissipating away from the region below the emitter 410, for example, to the ground via 422. In addition, a distance (e.g., ~50 um) of the heat 430 from the ground via 422 further inhibits the heat 430 from dissipating. This results in overheating and possible damage to the HBT device 400. As demand for higher operating frequencies increases, the thermal issues relating to HBTs will increase as well.

Aspects of the present disclosure may solve this problem by fabricating a heatsink for an HBT-based power amplifier directly under the heat source. In aspects of the present disclosure, the heatsink may be fabricated using a slightly modified backside via process. Thermal heat dissipation may be improved by reducing a distance between the heatsink and the HBT-based power amplifier heat source (e.g., ~1 um), which significantly improves HBT thermal conductivity (e.g., by ~50%). A backside ground via may also be fabricated in electrical contact with an emitter of an HBT active device, for example, as shown in FIGS. 5A-5B.

Figure 5A:
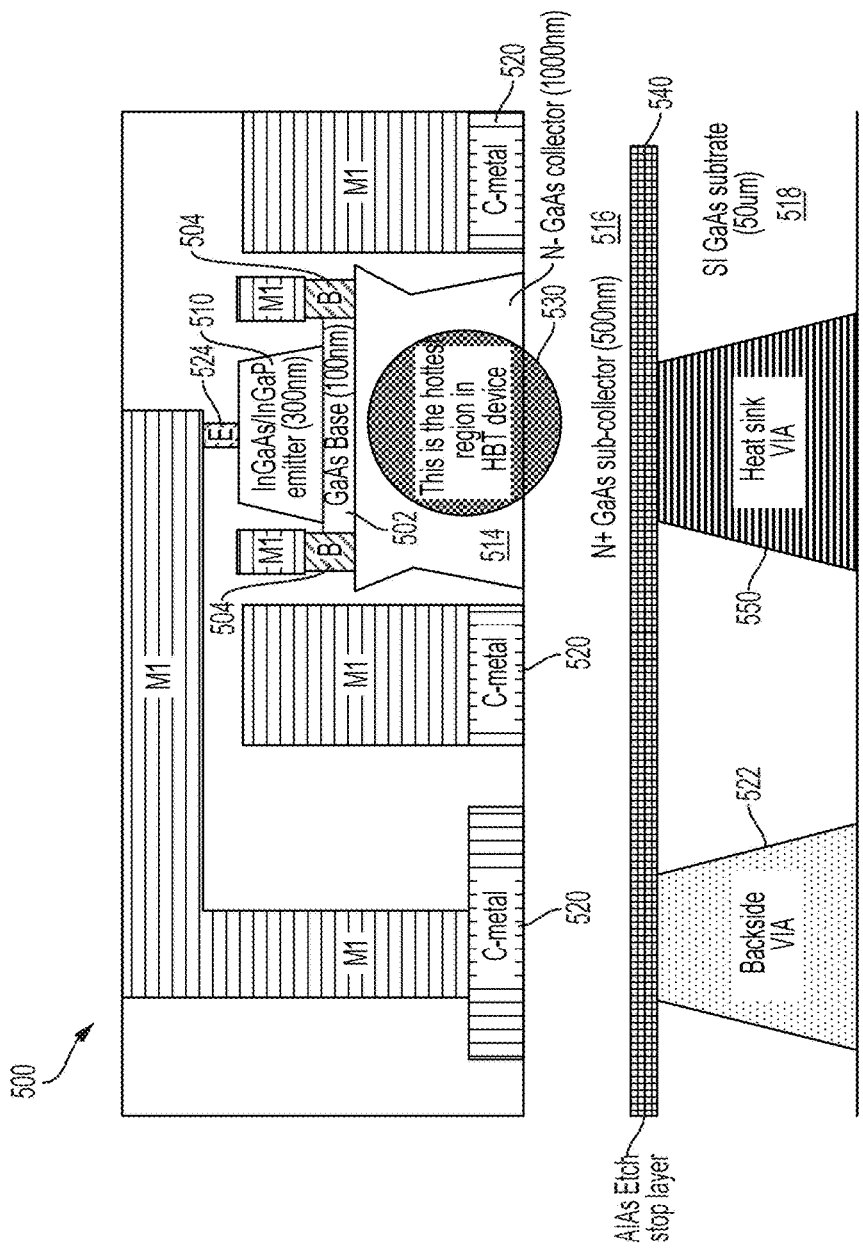
FIGS. 5A-5B show heterojunction bipolar transistor (HBT) power amplifiers with backside heatsinks, in accordance with various aspects of the present disclosure.
Figure 5B:
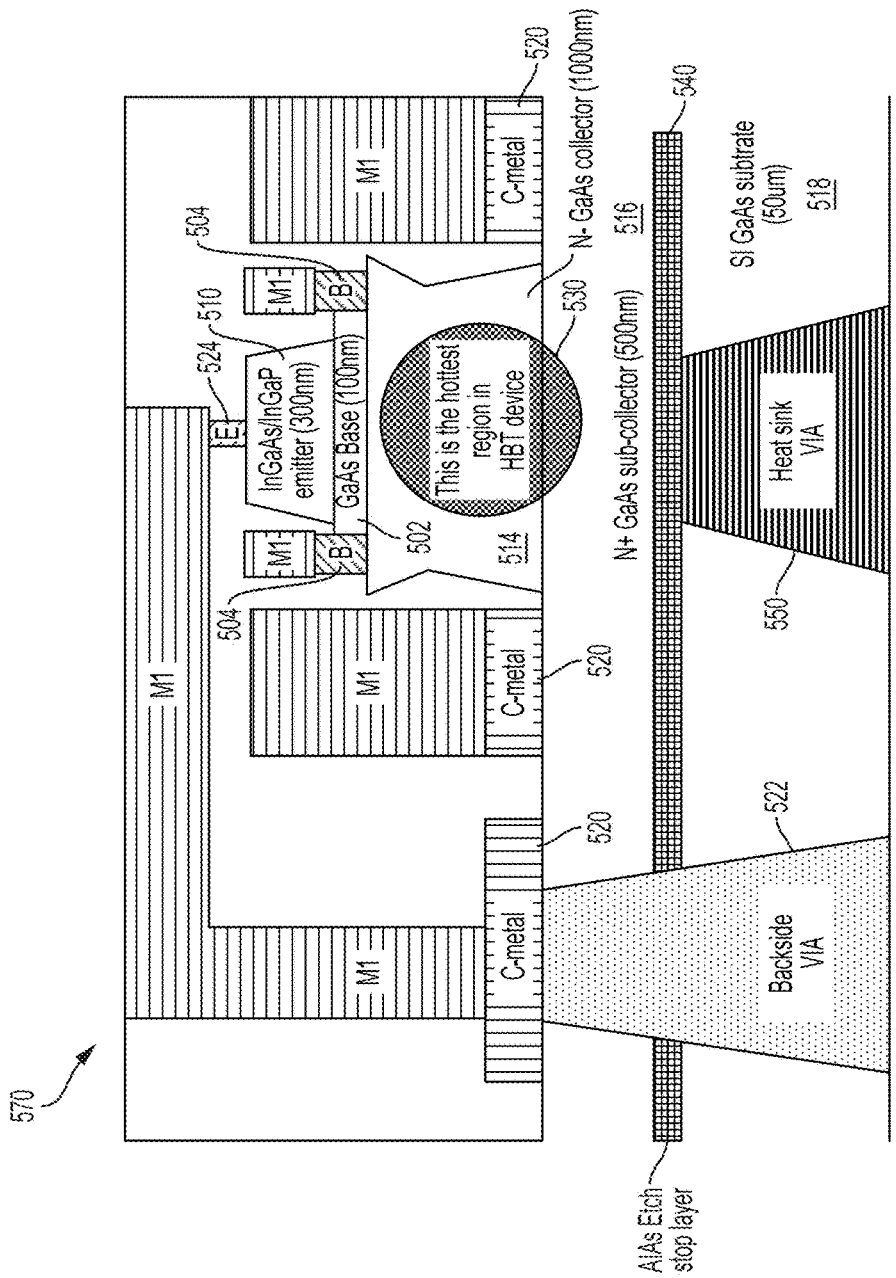

FIG. 5A shows a heterojunction bipolar transistor (HBT) power amplifier 500 with a backside heatsink 550 (e.g., a backside thermal heatsink via), in accordance with aspects of the present disclosure. The power amplifier 500 may include an emitter 510, a base 502 contacting the emitter 510, a collector 514 contacting the base 502, and a sub-collector 516 contacting the collector 514. The emitter 510 includes an emitter contact 524, the base includes base contacts 504, and the collector includes collector contacts 520. According to an aspect, one of the collector contacts 520 may be electrically coupled to the emitter contact 524 through a first metallization layer (M1). The sub-collector 516 may be supported by a compound semiconductor substrate 518. In the configuration shown n FIG. 5A, a thickness of the emitter 510 is three-hundred (300) nanometers (nm), and a thickness of the base 502 is one hundred nanometers (100 nm). In addition, a thickness of the collector 514 is one-thousand nanometers (1000 nm), a thickness of the sub-collector 516 is five-hundred nanometers (500 nm), and a thickness of the compound semiconductor substrate 518 is fifty nanometers (50 nm). These values are exemplary only, and other values are possible.

The emitter 510 may be composed of indium gallium arsenide (InGaAs) or indium gallium phosphide (InGaP). The base 502, the collector 514, and the sub-collector 516 may each be composed of gallium arsenide (GaAs). These materials are exemplary only, and other materials may be used. As noted, because the HBT power amplifier 500 combines compound semiconductor materials (e.g., a GaAs collector supporting InGaAs/InGaP emitter/base materials), thermal conductivity of the HBT power amplifier 500 is poor. As a result, heat 530 is trapped within the collector 514 of the HBT power amplifier 500. Without some way for dissipating, the heat 530, of the HBT power amplifier 500 may be damaged and may eventually fail.

According to an aspect, the backside heatsink 550 is thermally coupled to the sub-collector 516 and the collector 514. For example, the backside heatsink 550 may be formed by etching through the compound semiconductor substrate 518 during a front-end-of-line (FEOL) process. As an example, a timed etch may be used to stop on an electrical isolation layer 540 (e.g., etch stop layer). The electrical isolation layer 540 may contact both the sub-collector 516 and the compound semiconductor substrate 518. In addition, the electrical isolation layer 540 may serve as an electrical barrier to isolate the backside heatsink via 550 from electrically shorting the collector 514. According to additional aspects, the electrical isolation layer 540 may be a thermally conductive layer, an etch stop layer, and/or an electrical insulator layer. For example, the electrical isolation layer 540 may be aluminum arsenide (AlAs).

In accordance with aspects of the present disclosure, the backside heatsink 550 may be plated with a thermally conductive material, such as copper (Cu) or gold (Au). These are exemplary only, and other thermally conductive materials may be used. According to an aspect, the backside heatsink 550 is aligned with a central axis of the emitter 510 and the base 502. The backside heatsink via 550 may also be arranged to directly contact the electrical isolation layer 540. In this arrangement, the backside heatsink 550 enables dissipation of the heat 530, which reduces a junction temperature of the HBT power amplifier and prevents device breakdown. The backside heatsink 550 may be a backside thermal via. In another aspect, the backside heatsink via 550 may align with the base-emitter junction (e.g., between the emitter 510 and the base 502) or aligned with the base-collector junction (e.g., between the collector 514 and the base 502).

In this arrangement, at least one backside via 522 (e.g., backside ground via) may directly contact the electrical isolation layer 540. The backside via 522 may be plated with copper (Cu) or gold (Au). In contrast to the HBT device 400 of FIG. 4, the backside via 522 does not extend to contact the collector contacts 520 (e.g., collector metal).

The sub-collector 516 may include a III-V compound semiconductor material or a II-VI compound semiconductor material. These compound semiconductor materials may include, but are not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide: nitride (InGaAs:N). These are exemplary only, and other materials are possible.

In operation, heat accumulating in the collector 514 dissipates to the sub-collector 516, the electrical isolation layer 540, and out through the backside heatsink 550. Thus, the power amplifier 500 is protected from overheating and malfunctioning. Thermal heat dissipation may be further improved by reducing a distance between the backside heatsink 550 and the collector 514 (e.g., ~1 um), which significantly improves HBT thermal conductivity (e.g., by ~50%). The backside via 522 may also be fabricated in electrical contact with the emitter 510.

FIG. 5B shows another heterojunction bipolar transistor (HBT) power amplifier 570 with a backside heatsink 550, in accordance with aspects of the present disclosure. Similar to the power amplifier 500 described above with respect to FIG. 5A, the power amplifier 570 may include an emitter 510, a base 502 contacting the emitter 510, a collector 514 contacting the base 502, and a sub-collector 516 contacting the collector 514. The sub-collector 516 may be supported by a compound semiconductor substrate 518.

Additionally, the power amplifier 570 may include at least one backside via 522 (e.g., backside ground via) electrically coupled to the collector 514 at one of the collector contacts 520 (e.g., C-metal). For example, the backside via 522 may be etched through an electrical isolation layer 540 (e.g., etch stop layer) to contact one of the collector contacts 520. This process may include exposing collector contacts through the electrical isolation layer to provide backside ground via openings. This process may further include plating the backside heatsink via opening and the backside ground via openings with the thermally conductive material.

According to an aspect, the backside via 522 may further be electrically coupled to the emitter contact 524 of the emitter 510. For example, as described above, the backside via 522 may contact one of the collector contacts 520. Furthermore, metallization M1 (e.g., first metallization layer) may connect one of the collector contacts 520 to the emitter contact 524. Thus, the backside via 522 may be electrically coupled to the emitter contact 524 through one of the collector contacts 520 and metallization M1.

As noted above, the backside heatsink 550 (e.g., backside thermal via) may be thermally coupled to the sub-collector 516 and the collector 514 by etching through the compound semiconductor substrate 518 to stop at the electrical isolation layer 540. The backside heatsink 550 may be plated with a thermally conductive material, such as copper (Cu) or gold (Au), and may be aligned with a central axis of the emitter 510 and the base 502.

According to additional aspects, the electrical isolation layer 540 may be a thermally conductive layer, an etch stop layer, and/or an electrical insulator layer. For example, the electrical isolation layer 540 may be aluminum arsenide (AlAs), and may be located between the sub-collector 516 and the compound semiconductor substrate 518.

In operation, heat accumulating in the collector 514 dissipates out through the backside heatsink 550, thus preventing the power amplifier 570 from overheating and malfunctioning. Thermal heat dissipation may be improved by reducing a distance between the backside heatsink 550 and the collector 514 (e.g., ~1 um), which significantly improves HBT thermal conductivity (e.g., by ~50%). The backside via 522 may also be fabricated in electrical contact with the emitter 510.

Figure 6:
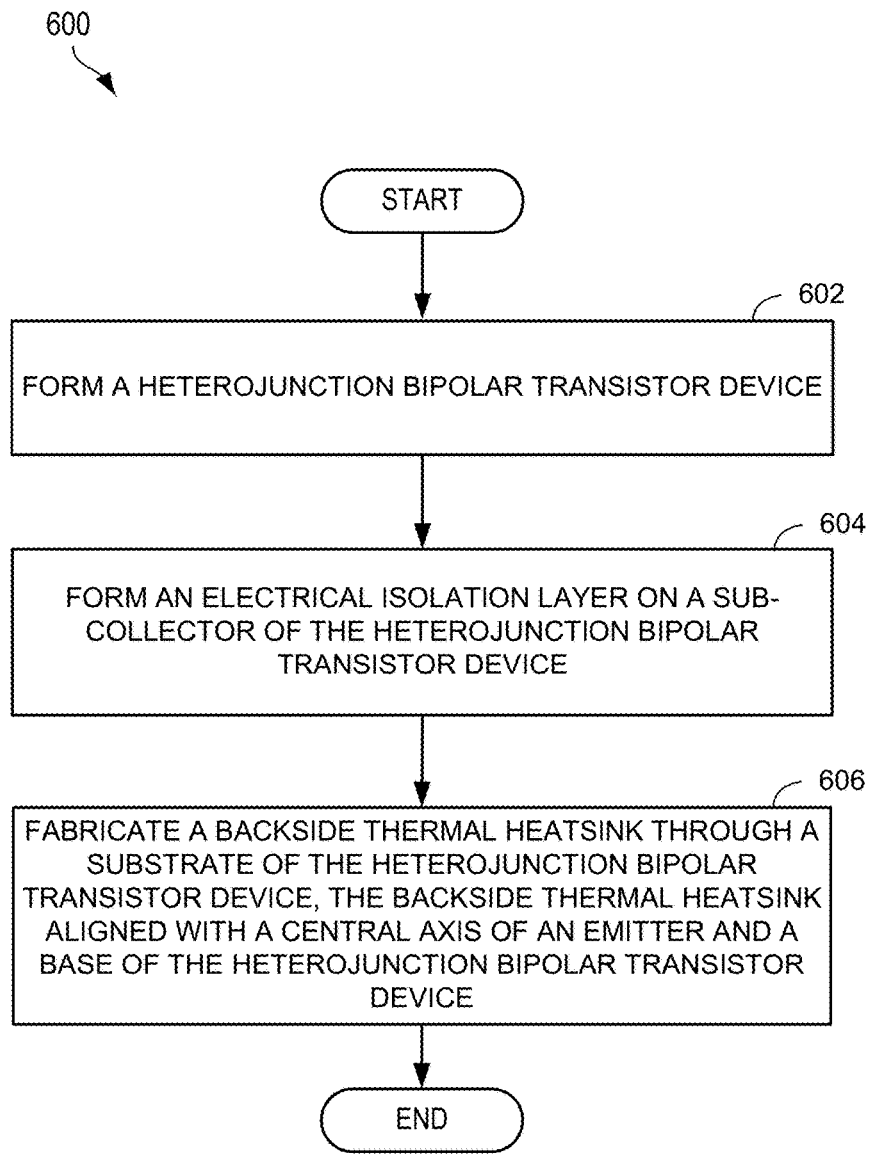
FIG. 6 is a flow diagram illustrating a method of making a backside heatsink for a heterojunction bipolar transistor (HBT) power amplifier, in accordance with aspects of the present disclosure.

FIG. 6 is a flow diagram illustrating a method of making a backside heatsink for a heterojunction bipolar transistor (HBT-based) power amplifier, in accordance with aspects of the present disclosure. The blocks in the method 600 can be performed in or out of the order shown, and in some aspects, can be performed at least in part in parallel.

At block 602, a heterojunction bipolar transistor device (HBT) is formed. For example, the heterojunction bipolar transistor device may be a component of an HBT-based power amplifier, such as the power amplifier 344 shown in FIG. 3. As shown in FIGS. 5A-5B, the HBT may include an emitter 510, a base 502 contacting the emitter 510, a collector 514 contacting the base 502, and a sub-collector 516 contacting the collector 514. The emitter 510 includes an emitter contact 524, the base includes base contacts 504, and the collector includes collector contacts 520. The sub-collector 516 may be supported by a compound semiconductor substrate 518. According to aspects, the HBT may be formed according to a conventional front end of line (FEOL) process.

At block 604, an electrical isolation layer is formed on a sub-collector of the heterojunction bipolar transistor device. For example, as shown in FIGS. 5A-5B, the sub-collector 516 supports a collector 514 of an HBT-based power amplifier. The electrical isolation layer 540 may be an etch stop layer formed on a side of the sub-collector 516 facing away from the collector 514.

At block 606, a backside thermal heatsink is fabricated through a substrate of the heterojunction bipolar transistor device. For example, as shown in FIGS. 5A-5B, the backside heatsink 550 may extend to the electrical isolation layer 540. A backside via 522 (e.g., backside ground via) may also be etched using the same etch process as the backside heatsink 550. For example, the backside via 522 may be etched simultaneously as the backside heatsink 550. According to an aspect, a backside via etch process may stop at the electrical isolation layer 540. The electrical isolation layer 540 may be an etch stop layer composed of aluminum arsenide (AlAs) or indium gallium phosphide (InGaP), for example. The electrical isolation layer 540 on top of the backside heatsink 550 may also serve as an electrical barrier to isolate the backside heatsink 550 from electrically shorting at the collector 514.

According to additional aspects, the backside heatsink 550 may be covered by a lithography step (e.g., a photoresist process). The electrical isolation layer 540 may then be etched to extend the backside via 522 through the electrical isolation layer 540 to stop on one of the collector contacts 520. According to an aspect, one of the collector contacts 520 may be electrically coupled to the emitter contact 524 through metallization M1. A seed metal may be sputtered, and a thermally conductive material (e.g., copper) is then plated on at least one of the backside via 522 and/or the backside heatsink 550.

In aspects of the present disclosure, the backside thermal heatsink may be aligned with a central axis of an emitter and a base of the heterojunction bipolar transistor device. For example, as shown in FIGS. 5A-5B, the backside heatsink 550 may be a backside thermal via aligned with a central axis of an emitter 510 and a base 502 of the HBT power amplifier 500 and the HBT power amplifier 570. In some examples, the backside thermal via may align with the emitter 510, an emitter-base junction, or a base-collector junction. For example, a width of the emitter-base junction (or the base-collector junction) may define a region in which the backside thermal via is arranged. That is, the backside thermal via does not overlap with base contacts 504 or collector contacts 520 of an HBT active device that are outside the region defined by the emitter-base junction, for example, as shown in FIGS. 5A-5B.

According to a further aspect of the present disclosure, a backside thermal heatsink for an HBT-based RF device (e.g., power amplifier (PA)) is described. The HBT-based power amplifier includes means for thermally dissipating heat from a collector of the HBT-based power amplifier through a sub-collector and an electrical isolation layer contacting the sub-collector. The means for thermally dissipating heat may, for example, include a backside heatsink 550, as shown in FIGS. 5A-5B. In another aspect, the aforementioned means may be any layer, module, or any apparatus configured to perform the functions recited by the aforementioned means.

A heterojunction bipolar transistor (HBT) implemented power amplifier may include an HBT integrated circuit (HBT chip). When integrated into 3G/4G enabled mobile phones, HBT power amplifiers may suffer from thermal issues. As a result, thermal stability is an important consideration during the design of HBT-based power amplifiers. Additionally, the compound semiconductor materials used by HBT-based power amplifiers may lead to localized thermal hot spots. The localized thermal hot spots are embedded in the device, and may reduce the ability to cool the hot spots and achieve low junction temperatures.

Conventionally, thermal instability may be caused by severe heat generated inside an HBT collector, for example, under an emitter/base region of an HBT-based power amplifier. Furthermore, compound semiconductor materials (e.g., gallium arsenide (GaAs)) used in the fabrication of HBT-based power amplifiers are poor thermal conductors as compared to non-compound semiconductor materials (e.g., four times worse than silicon (Si)), because heat does not readily dissipate from the substrate. Moreover, HBT emitter/base materials (e.g., indium GaAs (InGaAs)/indium gallium phosphide (InGaP)) exhibit poor thermal conductivity relative to GaAs (e.g., eight times worse). The increased heat does not readily spread through a top portion of the emitter. The thermal issues are further exacerbated by the advent of 5G and 5G+ power amplifiers, which operate at higher frequencies specifying more dynamic power.

Aspects of the present disclosure may solve this problem by fabricating a heatsink for an HBT-based power amplifier directly under the heat source. In aspects of the present disclosure, the heatsink may be fabricated using a modified backside via process. Thermal heat dissipation may be improved by reducing a distance between the heatsink and the HBT-based power amplifier heat source, which significantly improves HBT thermal conductivity. A backside ground via may also be fabricated in electrical contact with an emitter of an HBT active device.

Advantages include a direct outlet for heat generated by the HBT-based power amplifier by having a heatsink directly under the heat source. This results in better thermal control, increased functionality, and better reliability. For example, HBT thermal resistance may be improved. Additionally, the heatsink may be fabricated during the same process as for backside vias, while not changing the HBT fabrication process, and is thus inexpensive and easy to implement.

Figure 7:
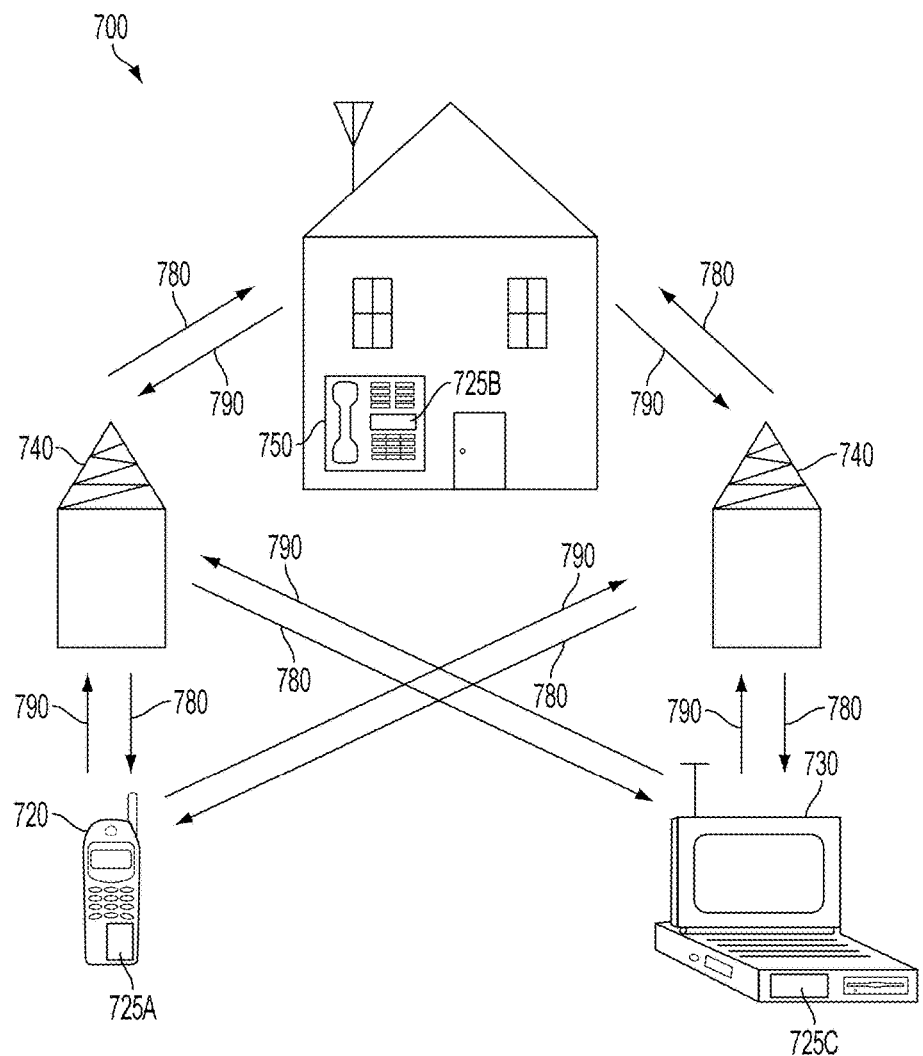
FIG. 7 is a block diagram showing an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed backside thermal heatsink. It will be recognized that other devices may also include the disclosed backside thermal heatsink, such as the base stations, user equipment, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed backside thermal heatsink.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A heterojunction bipolar transistor, comprising:
an emitter;
a base contacting the emitter;
a collector contacting the base;
a sub-collector contacting the collector;
means for dissipating heat from the collector through the sub-collector; and
a thermally conductive etch stop layer lining the sub-collector and arranged between the means for dissipating heat and the sub-collector.

2. The heterojunction bipolar transistor of claim 1, integrated into a chip of a wireless transceiver, the wireless transceiver incorporated into at least one of a music player, a video player, an entertainment unit, a navigation device, a communications device, a personal digital assistant (PDA), a fixed location data unit, a mobile phone, and a portable computer.

3. The heterojunction bipolar transistor of claim 1, in which the means for dissipating heat directly contacts a backside of the thermally conductive etch stop layer and a front-side of the thermally conductive etch stop layer lines the sub-collector.

4. The heterojunction bipolar transistor of claim 1, in which the sub-collector is comprised of a III-V compound semiconductor material or a II-VI compound semiconductor material.

5. The heterojunction bipolar transistor of claim 1, in which the thermally conductive etch stop layer comprises aluminum arsenide (AlAs).

6. A heterojunction bipolar transistor, comprising:
an emitter;
a base contacting the emitter;
a collector contacting the base;
a sub-collector contacting the collector;
a backside thermal via thermally coupled to the collector through the sub-collector, in which the backside thermal via is substantially aligned with the emitter and the base; and
a thermally conductive etch stop layer lining the sub-collector and arranged between the backside thermal via and the sub-collector.

7. The heterojunction bipolar transistor of claim 6, integrated into a chip of a power amplifier incorporated into at least one of a music player, a video player, an entertainment unit, a navigation device, a communications device, a personal digital assistant (PDA), a fixed location data unit, a mobile phone, and a portable computer.

8. The heterojunction bipolar transistor of claim 6, in which the backside thermal via directly contacts a backside of the thermally conductive etch stop layer and a front-side of the thermally conductive etch stop layer lines the sub-collector.

9. The heterojunction bipolar transistor of claim 6 in which the sub-collector is comprised of a III-V compound semiconductor material or a II-VI compound semiconductor material.

10. The heterojunction bipolar transistor of claim 6, in which the thermally conductive etch stop layer comprises aluminum arsenide (AlAs).

* * * * *